(12) United States Patent
Sharpe-Geisler et al.

(10) Patent No.: US 7,256,613 B1
(45) Date of Patent: Aug. 14, 2007

(54) PROGRAMMABLE INTERCONNECT ARCHITECTURE FOR PROGRAMMABLE LOGIC DEVICES

(75) Inventors: Brad Sharpe-Geisler, San Jose, CA (US); Om P. Agrawal, Los Altos, CA (US); Cindy Lee, San Jose, CA (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 104 days.

(21) Appl. No.: 11/165,709

(22) Filed: Jun. 24, 2005

(51) Int. Cl.
*H01L 25/00* (2006.01)
*H03K 19/177* (2006.01)

(52) U.S. Cl. .............................. 326/41; 326/39; 326/47
(58) Field of Classification Search ............ 326/37–41, 326/47
See application file for complete search history.

(56) References Cited

U.S. PATENT DOCUMENTS

| | | | |
|---|---|---|---|
| 5,260,611 A * | 11/1993 | Cliff et al. ..................... | 326/39 |
| 5,396,126 A | 3/1995 | Britton et al. | |
| 6,472,904 B2 | 10/2002 | Andrews et al. | |
| 6,937,064 B1 * | 8/2005 | Lewis et al. ................... | 326/40 |

OTHER PUBLICATIONS

The SFRA: A Corner-Turn FPGA Architecture; N. Weaver et al., FPGA Feb. 2004.

Max II Device Handbook, MII51002-1.2, Alteration Corporation, Dec. 2004.
XILINX, Spartan-3 FPGA Family: Complete Data Sheet, DS099, Jan. 17, 2005.
Cyclone Device Handbook, vol. 1, Altera Corporation, Feb. 2005.
XILINX, Virtex-II Platform FPGAs: Complete Data Sheet, DS031, (v3.4), Mar. 1, 2005.

* cited by examiner

*Primary Examiner*—Anh Q. Tran
(74) *Attorney, Agent, or Firm*—MacPherson Kwok Chen & Heid LLP; Jonathan W. Hallman

(57) ABSTRACT

In one embodiment of the invention, a programmable logic device (PLD) includes a plurality of programmable logic blocks arrayed in rows and columns, wherein each programmable logic block is coupled to a corresponding vertical routing resource and a corresponding horizontal routing resource, and wherein each vertical and horizontal routing resource includes a plurality of wires organized into wire groups and each programmable logic block has a set of inputs organized into input groups. The PLD also includes a plurality of connection boxes, each connection box corresponding to a programmable logic block and operable to couple a given wire group in one of the corresponding vertical and horizontal routing resources to a given input group independently of whether a given wire group in the remaining one of the corresponding vertical and horizontal routing resources is coupled through the connection box to the given input group.

20 Claims, 4 Drawing Sheets

PRIOR ART

PROGRAMMABLE INTERCONNECT ARCHITECTURE FOR PROGRAMMABLE LOGIC DEVICES

TECHNICAL FIELD

The present invention relates generally to programmable logic devices, and more particularly to a programmable interconnect architecture for programmable logic devices.

BACKGROUND

Programmable logic devices such as field programmable gate arrays (FPGAs) include a number of logic blocks that are interconnected by a programmable interconnect, also referred to as a routing structure. The programmable routing structure provides the routing for bringing input signals to the logic blocks as well as transmitting output signals from the logic blocks. Thus, the programmable routing structure may be configured to provide input signals to any given logic block either from input/output (I/O) circuits or from other logic blocks. Similarly, the programmable routing structure may be configured to route output signals from any given logic block to other logic blocks or to the I/O circuits.

A conventional field programmable gate array (FPGA) 100 is illustrated in FIG. 1. As is conventional in the programmable logic arts, logic blocks 120 in FPGA 100 are organized in a row and column fashion. In this exemplary embodiment, there are three rows R1 through R3 of programmable logic blocks 120. Similarly, there are three columns C1 through C3 of logic blocks 120. The routing structure for FPGA 100 is also organized in a row and column fashion. Thus, each row R1 through R3 includes a corresponding horizontal routing resource 130 whereas each column C1 through C3 includes a corresponding vertical routing resource 140.

Typically, each of these routing resources (which may include multiple switches, buffers, and wires) is segmented. For example, FIG. 2 illustrates a portion 200 of a routing resource with respect to a logic block 120. As illustrated, portion 200 routes in the horizontal direction but it will be appreciated that such an orientation is arbitrary in that portion 200 could also be taken from a vertical routing resource. A first routing segment X1 allows signals to flow between logic block 120 and an immediately adjacent logic block (not illustrated). With respect to FIG. 2, the immediately adjacent logic block would be located in the same row of logic blocks that contains logic block 120. Similarly, if portion 200 were taken from a vertical routing resource, the immediately adjacent logic block would be located in the same column of logic blocks that contains logic block 120. A second routing segment X2 allows signals to flow between logic block 120 and a logic block in the same row two blocks away, thereby spanning three blocks. Similarly, a third routing segment X3 allows signals to flow between logic block 120 and a logic block in the same row three blocks away. In general, a routing segment "XN" would denote a segment that spans an integer N+1 of logic blocks.

Regardless of the number or type of segments in the routing structure, a connection to external devices or signals is generally needed. For example, referring back to FIG. 1, FPGA 100 includes I/O circuits 150 that communicate with pins 160. As known in the art, signals can either flow into or out of FPGA 100 through pins 160. A number of different signaling protocols may be used for these signals such as LVCMOS 3.3V, LVCMOS 2.5V, LVCMOS 1.8V, LVDS, and others. I/O circuits 150 function to translate the external signaling protocol and the internal signaling protocol used within FPGA 100.

An FPGA 100 will typically include configurable interface blocks (CIBs) 170 through which horizontal and vertical routing resources 130 and 140 are coupled to I/O circuits 150. Connection boxes (also referred to as switch boxes or connection blocks) couple signals to and from logic blocks 120 to these routing resources. Turning now to FIG. 3a, the relationship between a logic block 120 and a corresponding connection box 300 (which may also be denoted as a switch box 300) is illustrated. Switch box 300 includes input and output switch matrices to flexibly route signals between horizontal and vertical routing resources 130 and 140 and logic block 120. In the embodiment illustrated, horizontal and vertical routing resources are segmented routing resources including segments X1, X2, and X8. Regardless of whether the routing resources are segmented, input signals may route through switch box 300 from the routing resources as lookup table inputs for lookup tables (LUTs) (discussed with respect to FIG. 3b) within logic block 120. Similarly, output signals from these LUTs may route through switch box 300 into routing resources 130 and 140.

A "bank" approach to organizing routing resources 130 and 140 with respect to this routing through switch box 300 is conventional. With respect to a segmented routing architecture, each bank represents a group of horizontal wires and associated group of vertical wire of the same segment length. For example, as seen in FIG. 3b, the X2 horizontal wires may be organized into two groups denoted as horizontal bundle 0 and horizontal bundle 1. Similarly, the X2 vertical wires may be organized into two groups denoted as vertical bundle 0 and vertical bundle 1. Horizontal bundle 0 and vertical bundle 0 form bank 0, and Horizontal bundle 1 and vertical bundle 1 form bank 1. A LUT 0 and a LUT 1 within logic block 120 (FIG. 3a) are shown. For illustration clarity, each bundle comprises just two wires each and each LUT receives just two input signals. LUT 0 receives input signals at inputs A0 and B0 whereas LUT 1 receives input signals at inputs A1 and B1. With respect to selection of these input signals from the simplified X2 routing shown in FIG. 3b, an input switch matrix 310 within switch box 300 (FIG. 3a) may comprise 4:1 multiplexers 320. It will be appreciated by those of ordinary skill in the art that input switch matrix 310 includes a plurality of "fuse points" controlled by configuration memory cells so that wires in the routing structure may be coupled to LUT inputs. For illustration clarity, these fuse points are not shown and are represented by multiplexers 320. A first 4:1 multiplexer 320a selects a signal from the wires in bank 0 (horizontal bundle 0 and vertical bundle 0) for input A0. A second 4:1 multiplexer 320b selects a signal from the wires in bank 1 (horizontal bundle 1 and vertical bundle 1) for input B0. Similarly, a third multiplexer 320c selects a signal from bank 0 to for input A1 whereas a fourth multiplexer 320d selects a signal from bank 1 for input B1.

Because the routing is bank-based, signals on one wire bundle within a bank cannot be routed independently of signals on another wire bundle within the same bank. For example, because horizontal bundle 0 and vertical bundle 0 form bank 0, input switch matrix 310 in each of LUT 0 and LUT 1 is configurable to route only a signal from horizontal bundle 0 or vertical bundle 0 to a one LUT input (A0 or A1) and to route only a signal from horizontal bundle 1 or vertical bundle 1 to the other LUT input (B0 or B1).

Although a bank-based routing architecture has proven to be very popular for routing because of its flexibility, the semiconductor die area for the necessary input switch boxes can be considerable. In addition, a significant portion of the total routing delay and power consumption occurs in the switch boxes. Accordingly, there is a need in the art for an improved routing architecture that provides sufficient routing flexibility yet alleviates these problems.

SUMMARY

In accordance with an embodiment of the invention, a programmable logic device includes: a plurality of programmable logic blocks arrayed in rows and columns, wherein each programmable logic block is coupled to a corresponding vertical routing resource and a corresponding horizontal routing resource, and wherein each vertical and horizontal routing resource includes a plurality of wires organized into wire groups and each programmable logic block has a set of inputs organized into input groups; and a plurality of connection boxes, each connection box corresponding to a programmable logic block and operable to couple a wire group to an input group, wherein a given wire group in one of the corresponding vertical and horizontal routing resources is couplable to a given input group independently of whether a given wire group in the remaining one of the corresponding vertical and horizontal routing resources is also couplable to the given input group.

In accordance with another embodiment of the invention, a programmable logic device includes: a programmable logic block having a set of inputs organized into input groups; a horizontal routing resource; a vertical routing resource, wherein the vertical routing resource and horizontal routing resource each includes a plurality of wires organized into wire groups; and a switch matrix configured to couple a wire group to an input group, wherein a given wire group in the horizontal routing resource is couplable to a given input group independently of whether another wire group in the vertical routing resource is also couplable coupled to the given input group.

In accordance with another embodiment of the invention, a programmable logic device is provided that includes: a plurality of vertical routing resources; a plurality of horizontal routing resources, wherein at least a first one of the horizontal routing resources and at least a first one of the vertical routing resources both include a plurality of wires organized into at least a first wire group and a second wire group; a first input switch matrix operable to select signals from the first wire group in the first horizontal routing resource and from the first wire group in the first vertical routing resources to provide an input signal to a first lookup table (LUT) input; and a second input switch matrix operable to select signals from the first wire group in the first horizontal routing resource and from the second wire group in the first vertical routing resource to provide an input signal to a second LUT input.

BRIEF DESCRIPTION OF THE DRAWINGS

Use of the same reference symbols in different figures indicates similar or identical items.

DETAILED DESCRIPTION

Reference will now be made in detail to one or more embodiments of the invention. While the invention will be described with respect to these embodiments, it should be understood that the invention is not limited to any particular embodiment. On the contrary, the invention includes alternatives, modifications, and equivalents as may come within the spirit and scope of the appended claims. Furthermore, in the following description, numerous specific details are set forth to provide a thorough understanding of the invention. The invention may be practiced without some or all of these specific details. In other instances, well-known structures and principles of operation have not been described in detail to avoid obscuring the invention.

Figure 4:
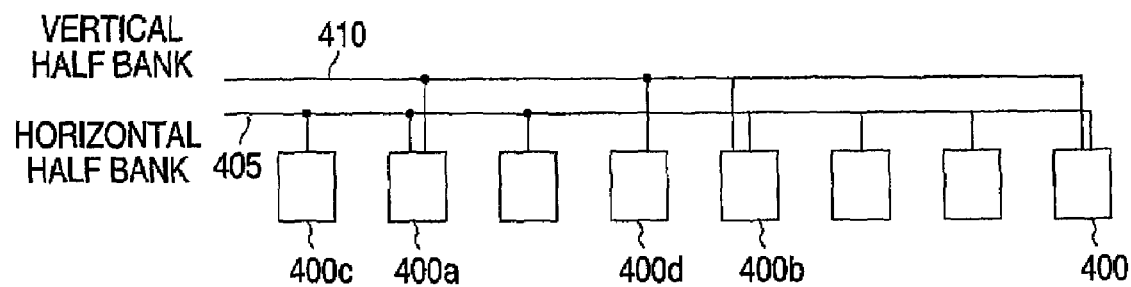
FIG. 4 is a block diagram for a vertical and horizontal half bank and an associated programmable logic block in accordance with an embodiment of the invention.

An improved programmable interconnect (routing) architecture for programmable logic devices such as FPGAs is disclosed. Although wires in the routing structure are bundled or grouped in this architecture, the horizontal routing resources are organized into groups (denoted herein as "half-banks") such that signals carried on a horizontal half bank may be provided to logic block inputs independently from the routing used for the vertical half banks. For example, consider an exemplary programmable logic block having eight lookup tables (LUTs) 400 as shown in FIG. 4. A horizontal half-bank 405 couples through an input switch matrix of a switch box (not illustrated) to selected LUT input(s) such as inputs corresponding to LUTs 400a, 400b, and 400c. Similarly, a vertical half-bank 410 couples through the input switch matrix to selected ones of the LUTs such as LUTs 400a, 400b, and 400d. It will be appreciated that each half-bank represents a collection of wires in the corresponding vertical or horizontal routing resource. However, for illustration clarity this collection of wires is illustrated as a single line for each half-bank in FIG. 4.

In the embodiment illustrated in FIG. 4, the input switch matrix is configured such that input signals to LUTs 400a and 400b may be selected from both half-banks 405 and 410. As discussed previously, conventional bank-based switch box routing is organized such that the horizontal and vertical routing resources within a given bank cannot be addressed independently. Should a conventional input switch matrix be configurable to select a signal from the horizontal bundle to a given LUT input, then the input switch matrix will also be configurable to select a signal from the vertical bundle for the same LUT input. Thus, if half-banks 405 and 410 were organized into a conventional bank, the corresponding input switch matrix could not couple signals from half-bank 405 to a set of LUT inputs without also being configurable to couple signals from half-bank 410 to the set of LUT inputs.

However, in a half-bank approach, the routing flexibility is substantially increased. For example, suppose there are four horizontal half-banks and four vertical half-banks. With respect to a given group of LUT inputs, this architecture allows for sixteen combinations of vertical and horizontal half banks. In sharp contrast, a conventional four bank architecture provides only four possible banks to choose from with respect to a group of LUT inputs.

The benefits of a half-bank routing architecture may be utilized in either a segmented or non-segmented routing architecture. The following discussion will assume without loss of generality that a segmented routing architecture is implemented. For example, consider a segmented routing architecture having segments X0, X1, X2, and X6 in both the vertical and horizontal routing resources.

Although the number of half-banks for each routing segment is arbitrary, a convenient choice is to use multiples of the LUT input set for certain segments.

For example, in one embodiment, if a programmable logic block employs four-input LUTs, the number of half-banks for each segment may be chosen as integer multiples of four for segments X2, X6, and X0. It will be appreciated that not only is routing flexibility enhanced in a half-bank routing architecture but the ability to select between common control and independent control is also enhanced.

Figure 5:
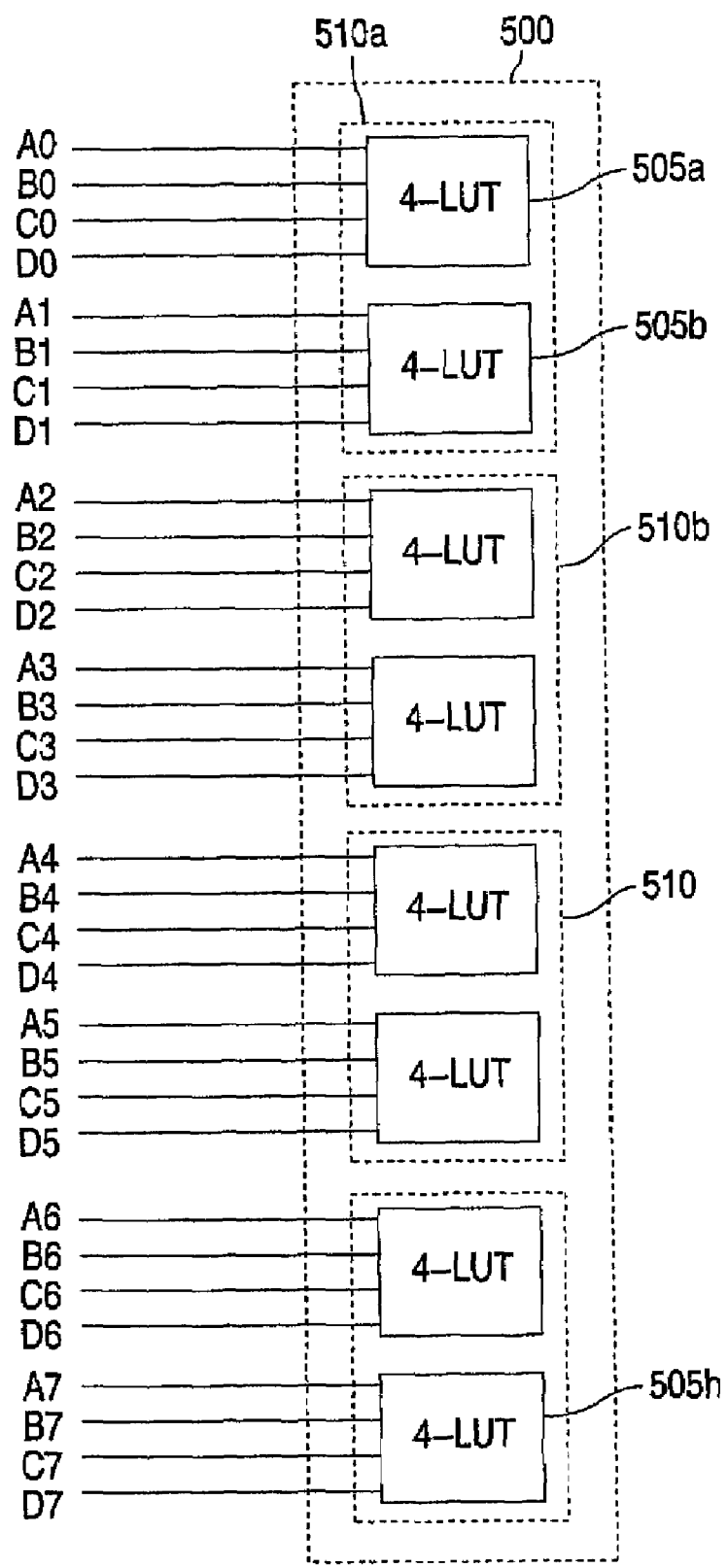
FIG. 5 illustrates a particular grouping of inputs for a programmable logic block in accordance with an embodiment of the invention.

An exemplary grouping of inputs for a programmable logic block 500 having eight 4-input LUTs 505 is illustrated in FIG. 5. Each LUT 505 has four inputs A through D. To differentiate the inputs for the various LUTs, a first LUT 505a has its inputs designated as A0 through D0. Similarly, a second LUT 505b has its inputs designated as A1 though D0, and so on for the remaining LUTs such that a last LUT 505h has its inputs designated as A7 through D7.

As known in the arts, LUTS 505 may be organized into slices 510, each slice having two LUTs each. Within each slice, the LUT inputs are organized (with respect to half-bank routing) into 4 groups. For example, with respect to a first slice 510a, the LUT input groupings are {A0, A1}, {B0, B1}, {C0, C1}, {D0, D1}. This grouping may be repeated for the remaining slices. Thus, a second slice 510b has LUT input groupings of {A2, A3}, {B2, B3}, {C2, C3}, {D2, D3}, and so on for the remaining slices.

A segmented routing structure may be organized into half-banks that couple to these input groupings accordingly. For example, a vertical X2 routing resource and a horizontal X2 routing resource may each be organized into eight half-banks such that the X2 routing has a total of sixteen half-banks. The half-banks in the horizontal X2 routing resource may be designated as half-banks H0 through H7. Similarly, the half-banks in the vertical X2 routing resource may be designated as half-banks V0 through V7.

Given such a routing resource and LUT input organization, the input switch matrix for the connection box corresponding to programmable logic block 500 may be organized to provide different routings, as set forth in the following table:

TABLE 1

| A0/A1 | B0/B1 | C0/C1 | D0/D1 |
|---|---|---|---|
| H4 | H2 | H0 | H6 |
| V4 | V6 | V0 | V2 |
| H5 | H3 | H1 | H7 |
| V5 | V7 | V1 | V3 |

| A2/A3 | B2/B3 | C2/C3 | D2/D3 |
|---|---|---|---|
| H4 | H2 | H0 | H6 |
| V6 | V0 | V2 | V4 |

TABLE 1-continued

| H5 | H3 | H1 | H7 |
|---|---|---|---|
| V7 | V1 | V3 | V5 |

| A4/A5 | B4/B5 | C4/C5 | D4/D5 |
|---|---|---|---|
| H4 | H2 | H0 | H6 |
| V0 | V2 | V4 | V6 |
| H5 | H3 | H1 | H7 |
| V1 | V3 | V5 | V7 |

| A6/A7 | B6/B7 | C6/C7 | D6/D7 |
|---|---|---|---|
| H4 | H2 | H0 | H6 |
| V2 | V4 | V6 | V0 |
| H5 | H3 | H1 | H7 |
| V3 | V5 | V7 | V1 |

As discussed above, A0-D7 are LUT inputs and H0-H7, V0-V7 represent distinct groups of wires. For example, for inputs A0/A1, associated wire groups H4, V4, H5 and V5 may be routed through the connection box to these inputs. For A2/A3, the wire groups are mixed such that groups H4, V6, H5, and V7 may be routed to these inputs. In the prior art, by contrast, once an association between wire groups has been made with respect to one LUT input, that association would be maintained with respect to other LUT inputs. For example, with respect to LUT input A0, wire groups H4 and V4 are associated. In a bank-based approach, this association would have to be maintained, thereby limiting routing flexibility.

Figure 6:
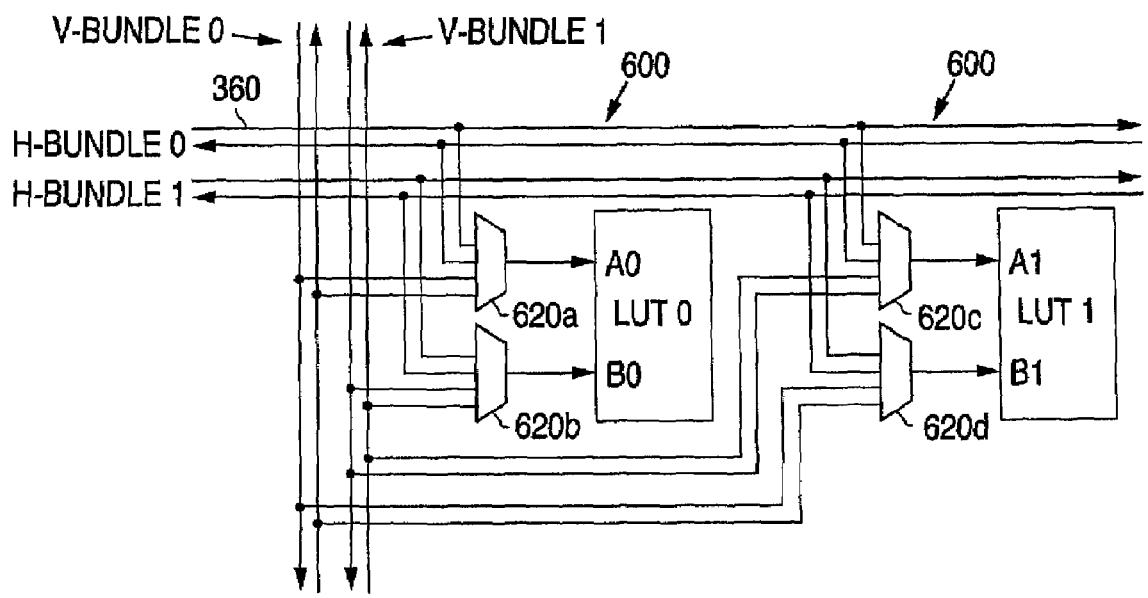
FIG. 6 illustrates a portion of an input switch matrix that routes input signals to particular LUT input groups selected from the grouping of FIG. 5.

FIG. 6 shows one embodiment of the invention. Input switch matrix 600 includes 4:1 multiplexers 620. A first 4:1 multiplexer 620a selects from horizontal bundle H0 and vertical bundle V0 to provide signals to input A0 of LUT 0. Similarly, a second 4:1 multiplexer 620b selects from horizontal bundle H1 and vertical bundle H1 to provide signals to input B0 of LUT 0. However, a third 4:1 multiplexer 620c, rather than selecting among H0 and V0 of H1 and V1, selects from horizontal bundle H0 and vertical bundle V1 to provide signals to input A1 of LUT 1. In sharp contrast, in the conventional approach shown in FIG. 3b, horizontal wire groups are always routed with associated vertical groups. The routing flexibility that is enabled by the inventive routing architecture becomes important as the routing structure is depopulated to ease die space and power consumption demands. For example, referring to the conventional routing architecture of FIG. 3b, suppose a common control signal is routed to both LUT 0 and LUT 1 using a wire 360 in horizontal bundle H0. Such a common control signal routing would be used, for example, for a carry chain. Corresponding data signals for the carry chain may be distributed across vertical wire bundles. Multiplexers 320a and 320c may be configured to select for the common control signal on wire 360 to provide LUT inputs A0 and A1, respectively. Should a circuit design require that input B0 or B1 receive a signal (such as a data signal in a carry chain) carried on vertical bundle V0, however, the design will fail because multiplexers 320b and 320d couple only to bank 1 (H1/V1) and thus cannot select for signals carried on vertical bundle V0.

Figure 1:
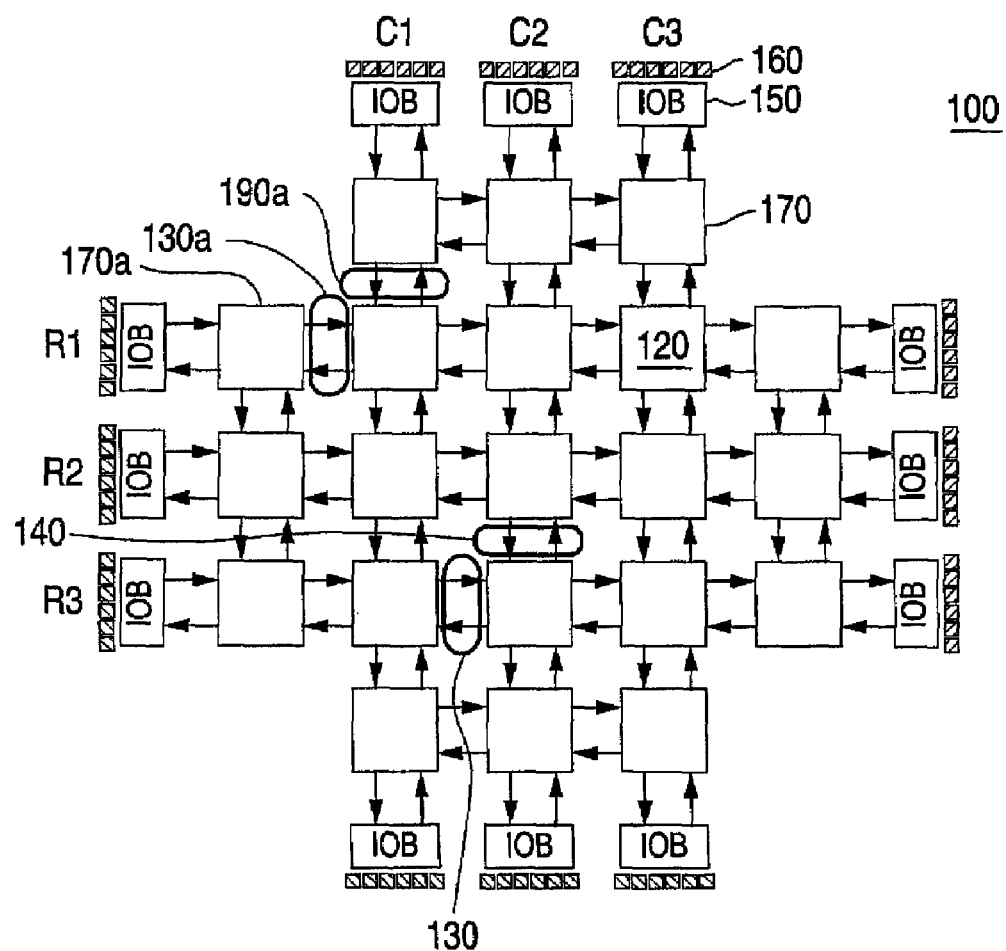
FIG. 1 is a block diagram of a conventional field programmable gate array.
Figure 2:
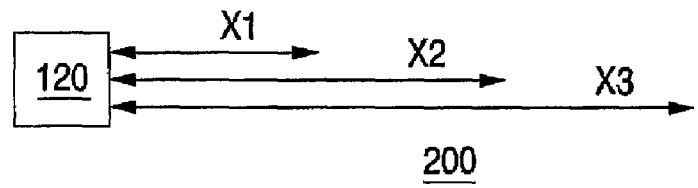
FIG. 2 is a block diagram of a portion of a conventional segmented routing resource.
Figure 3A:
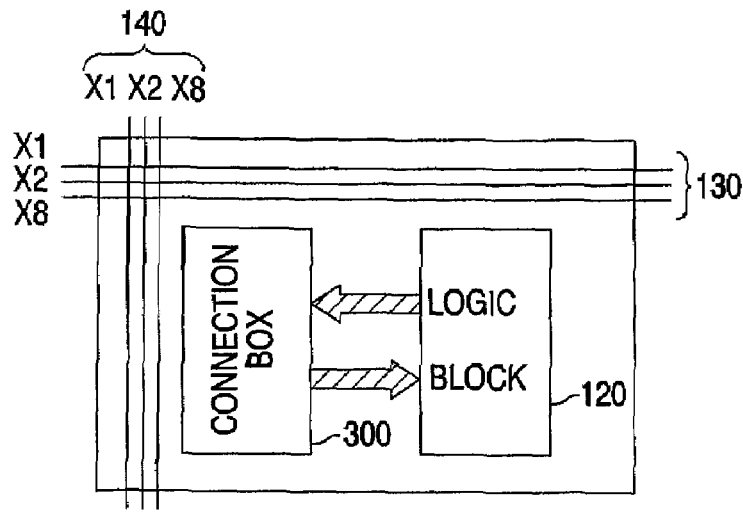
FIG. 3a illustrates the relationship between a conventional routing switch box and an associated programmable logic block.
Figure 3B:
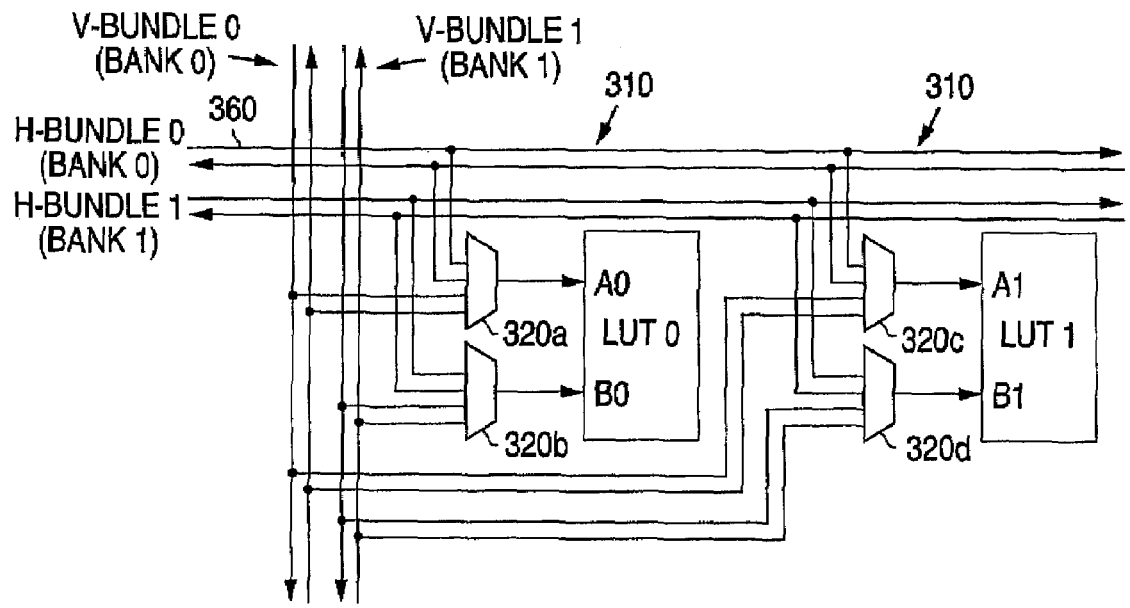
FIG. 3b illustrates the relationship between a portion of the switch box of FIG. 3a and particular banks and LUT inputs.

Note that in the inventive routing architecture shown in FIG. 6, multiplexers 620a and 620c may be configured to select for the signal carried on wire 360, analogously as shown in FIG. 3b. However, because of the bundle permutation with respect to LUT inputs B0 and B1, multiplexer 620d may select from signals carried on vertical bundle V0 and thus support the design that failed in the architecture of FIG. 3b. In the inventive routing architecture, an FPGA designer may choose to associate particular half-banks independently of each other. For example, LUT input A0 may be selected from horizontal and vertical bundles H0 and V0, whereas LUT input A1 may be selected from horizontal bundle H0 and vertical bundle V1. In this fashion, the routing resources (such as number of wires in a particular segment) may be sharply reduced as compared to the conventional architecture while maintaining suitable routing flexibility.

The above-described embodiments of the present invention are merely meant to be illustrative and not limiting. It will thus be obvious to those skilled in the art that various changes and modifications may be made without departing from this invention in its broader aspects. For example, although the present routing architecture has been described with respect to a segmented routing structure architecture, this architecture may also be implemented in programmable logic devices with non-segmented routing architectures. Accordingly, the appended claims encompass all such changes and modifications as fall within the true spirit and scope of this invention.

We claim:

1. A programmable logic device, comprising:
    a plurality of programmable logic blocks arrayed in rows and columns, wherein each programmable logic block is coupled to a corresponding vertical routing resource and a corresponding horizontal routing resource, and wherein each vertical and horizontal routing resource includes a plurality of wires organized into wire groups and each programmable logic block has a set of inputs organized into input groups; and
    a plurality of connection boxes, each connection box corresponding to a programmable logic block and operable to couple a wire group to an input group, wherein a given wire group in one of the corresponding vertical and horizontal routing resources is couplable to a given input group independently of whether a given wire group in the remaining one of the corresponding vertical and horizontal routing resources is also couplable to the given input group.

2. The programmable logic device of claim 1, wherein each horizontal and vertical routing resource is a segmented routing resource.

3. The programmable logic device of claim 1, wherein each programmable logic block comprises a plurality of lookup tables.

4. The programmable logic device of claim 3, wherein each lookup table is a four-input lookup table.

5. The programmable logic device of claim 4, wherein each programmable logic block comprises at least eight lookup tables.

6. The programmable logic device of claim 2, wherein the segmentation of each horizontal and vertical routing resource comprises a segment-0 resource, a segment-1 resource, a segment-2 resource, and a segment-6 resource.

7. The programmable logic device of claim 3, wherein the programmable logic device comprises a field programmable gate array.

8. The programmable logic device of claim 1, further comprising:
    a configuration memory operable to store configuration data for configuring the plurality of switch matrices.

9. The programmable logic device of claim 8, wherein the configuration memory is a volatile memory.

10. A programmable logic device, comprising:
    a programmable logic block having a set of inputs organized into input groups;
    a horizontal routing resource;
    a vertical routing resource, wherein the vertical routing resource and horizontal routing resource each includes a plurality of wires organized into wire groups; and
    a switch matrix configured to couple a wire group to an input group, wherein a given wire group in the horizontal routing resource is couplable to a given input group independently of whether another wire group in the vertical routing resource is also couplable to the given input group.

11. The programmable logic device of claim 10, wherein the input groups comprise sixteen input groups.

12. The programmable logic device of claim 10, wherein the logic block includes eight four-input lookup tables having their thirty-two inputs organized into sixteen two-input groups.

13. The programmable logic device of claim 10, wherein the horizontal and routing resource is each a segment-2 routing resource having its plurality of wires organized into eight wire groups.

14. The programmable logic device of claim 12, wherein the lookup tables are organized into four slices.

15. A programmable logic device, comprising:
    a plurality of vertical routing resources;
    a plurality of horizontal routing resources, wherein at least a first one of the horizontal routing resources and at least a first one of the vertical routing resources both include a plurality of wires organized into at least a first wire group and a second wire group;
    a first input switch matrix operable to select signals from the first wire group in the first horizontal routing resource and from the first wire group in the first vertical routing resources to provide an input signal to a first lookup table (LUT) input; and
    a second input switch matrix operable to select signals from the first wire group in the first horizontal routing resource and from the second wire group in the first vertical routing resource to provide an input signal to a second LUT input.

16. The programmable logic device of claim 15, wherein the first and second input switch matrices comprise multiplexers within a connection box operable to connect a programmable logic block containing LUTs to the horizontal and vertical routing resources.

17. The programmable logic device of claim 15, wherein the plurality of vertical routing resources and the plurality of horizontal routing resources are both segmented routing resources.

18. The programmable logic device of claim 15, wherein the first and second LUT inputs are inputs to a same LUT.

19. The programmable logic device of claim 15, wherein the first and second LUT inputs are inputs to different LUTs.

20. The programmable logic device of claim 15, wherein the first and second wire groups each includes a plurality of wires greater than two.

* * * * *